(12) United States Patent
Yamazaki et al.

(10) Patent No.: US 10,914,758 B2
(45) Date of Patent: Feb. 9, 2021

(54) INSPECTION JIG PROVIDED WITH PROBE, SUBSTRATE INSPECTION DEVICE PROVIDED WITH SAME, AND METHOD FOR MANUFACTURING INSPECTION JIG

(71) Applicant: Nidec-Read Corporation, Kyoto (JP)

(72) Inventors: Hidekazu Yamazaki, Kyoto (JP); Norihiro Ota, Kyoto (JP)

(73) Assignee: Nidec-Read Corporation, Kyoto (JP)

( * ) Notice: Subject to any disclaimer, the term of this patent is extended or adjusted under 35 U.S.C. 154(b) by 84 days.

(21) Appl. No.: 16/319,827

(22) PCT Filed: Jul. 20, 2017

(86) PCT No.: PCT/JP2017/026276
§ 371 (c)(1),
(2) Date: Jan. 23, 2019

(87) PCT Pub. No.: WO2018/021140
PCT Pub. Date: Feb. 1, 2018

(65) Prior Publication Data
US 2019/0271722 A1  Sep. 5, 2019

(30) Foreign Application Priority Data
Jul. 28, 2016 (JP) .................................. 2016-148742

(51) Int. Cl.
*G01R 1/073* (2006.01)
*G01R 3/00* (2006.01)
(Continued)

(52) U.S. Cl.
CPC ......... *G01R 1/07371* (2013.01); *G01R 1/073* (2013.01); *G01R 3/00* (2013.01);
(Continued)

(58) Field of Classification Search
CPC ................ G01R 1/073; G01R 1/07342; G01R 1/07371; G01R 31/26; G01R 31/2601;
(Continued)

(56) References Cited

U.S. PATENT DOCUMENTS 6,292,004 B1 * 9/2001 Kocher .............. G01R 1/07371
324/754.11
6,661,244 B2 * 12/2003 McQuade .......... G01R 1/07314
324/756.03
(Continued)

FOREIGN PATENT DOCUMENTS

JP  H0629359   2/1994
JP  H09274054  10/1997
(Continued)

OTHER PUBLICATIONS

"International Search Report (Form PCT/ISA/210) of PCT/JP2017/026276," dated Oct. 24, 2017, with English translation thereof, pp. 1-4.

*Primary Examiner* — Vinh P Nguyen
(74) *Attorney, Agent, or Firm* — JCIPRNET

(57) ABSTRACT

This inspection jig is provided with: an inspection-side support member having a counter plate (51) provided with a facing surface (F) disposed to face the substrate; and an electrode-side support member (6) having supporting plates (61-63) disposed to face an electrode plate (9) located on the side opposite to the facing surface (F) of the counter plate (51) A probe supporting hole (23), into and by which the rear end portion of the probe (Pr) is inserted and supported, is provided in the supporting plates (61-63), and the probe supporting hole (23) is provided with a restricting surface which is formed along a supporting line (V) inclined at a certain angle (θ) with respect to a reference line (Z), and which restricts the rear end portion of the probe (Pr) from
(Continued)

moving in the direction perpendicular to the inclined direction of the supporting line (V).

9 Claims, 12 Drawing Sheets

(51) Int. Cl.
 *G01R 31/26* (2020.01)
 *G01R 31/28* (2006.01)
(52) U.S. Cl.
 CPC ......... *G01R 31/26* (2013.01); *G01R 31/2601* (2013.01); *G01R 31/28* (2013.01)
(58) Field of Classification Search
 CPC .. G01R 31/28; G01R 3/00; G01R 31/318511; G01R 31/318513; G01R 31/318516; G01R 31/31519; G01R 31/8522
 See application file for complete search history.

(56) References Cited

U.S. PATENT DOCUMENTS

| 7,952,373 | B2* | 5/2011 | Mok | G01R 1/07342 |
| | | | | 324/750.24 |
| 2009/0230975 | A1* | 9/2009 | Yamada | G01R 1/0735 |
| | | | | 324/537 |
| 2015/0168463 | A1* | 6/2015 | Banaska | H05K 1/0219 |
| | | | | 324/76.11 |

FOREIGN PATENT DOCUMENTS

| JP | H1194875 | 4/1999 |
| JP | 2001235514 | 8/2001 |
| JP | 2003207523 | 7/2003 |
| JP | 2005338065 | 12/2005 |
| JP | 2008249460 | 10/2008 |
| JP | 2014240788 | 12/2014 |
| JP | 2015049078 | 3/2015 |

\* cited by examiner ary applicaton serial no. PCT/JP2017/026276, filed on Jul.

INSPECTION JIG PROVIDED WITH PROBE, SUBSTRATE INSPECTION DEVICE PROVIDED WITH SAME, AND METHOD FOR MANUFACTURING INSPECTION JIG

CROSS-REFERENCE TO RELATED APPLICATION

This application is a 371 application of the International PCT application serial no. PCT/JP2017/026276, filed on Jul. 20, 2017, which claims the priority benefits of Japan Patent Application No. 2016-148742, filed on Jul. 28, 2016. The entirety of each of the above-mentioned patent applications is hereby incorporated by reference herein and made a part of this specification.

TECHNICAL FIELD

The disclosure relates to an inspection jig that brings a probe into contact with an inspection point provided on a substrate which is an inspection object, a substrate inspection device having the same, and a method for manufacturing the inspection jig.

BACKGROUND ART

An inspection jig is used to detect electrical characteristics of an inspection object by supplying electric power (an electrical signal or the like) to an inspection object portion (an inspection point) of the inspection object which is a substrate from an inspection device via a probe (a contact pin) and detects an electrical output signal from the inspection object, to perform an operation test, or the like.

Examples of a substrate which is an inspection object include various substrates such as a printed circuit board, a flexible board, a ceramic multilayer circuit board, an electrode plate for a liquid crystal display or a plasma display, and a package substrate or a film carrier for a semiconductor package, a semiconductor wafer, and a semiconductor substrate of a semiconductor chip, a chip size package (CSP), or the like. In this specification, an inspection object portion which is set on such a substrate is referred to as an "inspection point."

For example, when a semiconductor circuit such as an IC or an electrical or electronic component such as a resistor is mounted in a substrate which is an inspection object, electrodes such as wirings or solder bumps serve as inspection points. In this case, electrical characteristics such as a resistance value between predetermined inspection points on wirings formed on a printed circuit board, a liquid crystal panel, or a plasma display panel before the electrical or electronic component has been mounted thereon and the quality of the wirings is determined in order to guarantee accurate transmission of an electrical signal to the mounted component.

Specifically, determination of the quality of a wiring is performed by bringing a probe for supply of a current and a probe for measurement of a voltage into contact with each of the inspection points on an inspection object, supplying a measuring current to the inspection points from the probe for supply of a current, measuring a voltage of the wiring between the tips of the probe for measurement of a voltage brought into contact with the inspection points, and calculating a resistance value of the wiring between predetermined inspection points based on the supplied current and the measured voltage.

When an inspection object is inspected using a substrate inspection device, predetermined inspection is performed in a state in which an inspection probe of an inspection jig is in contact with inspection points on a substrate which is an inspection object by operating a jig moving mechanism. When the inspection ends, the inspection jig is moved and separated from the substrate to be inspected by the jig moving mechanism. Control is performed in this way.

For example, as disclosed in Patent Literature 1, a prober (a substrate inspection device) including a probe needle in which one end is connected to an inspection device side that inspects electrical characteristics of an inspection object, the other end is connected to the inspection object, and a bending portion is formed at a predetermined position thereon and guide plates in which insertion holes into and by which the ends of the probe needle is inserted and supported are formed is known, in which the insertion holes are formed in a conical shape by a tapered surface inclined to be taped toward the inspection object.

By inserting the probe needle extending in a straight line shape into through-holes of two guide plates which are disposed to be parallel to each other with a predetermined gap therebetween, fixing the probe needle to inner walls of the through-holes of the two guide plates, moving the guide plates relative to each other to form a bending portion in the probe needle, releasing the fixation to the through-hole of at least one guide plate, and bending all probe needles together by fitting a frame between the two guide plates and supporting the two guide plates to be parallel to each other, a bending portion is formed at a predetermined position of probe needles with the same shape to keep the bending directions of the probe needles constant and thus it is possible to prevent neighboring probe needles from coming in contact with each other and to decrease the slope of the tip portions of the probe needles.

As disclosed in Patent Literature 2, an inspection jig including a front-tip support member including a front-tip insertion hole that has a probe guiding direction toward an inspection object (an object to be inspected), a rear-tip support member that is disposed behind the front-tip support member with a gap therebetween and that includes a rear-tip insertion hole having a probe guiding direction inclined with respect to the probe guiding direction of the front-tip insertion hole, a probe being flexible with elasticity that includes a front-tip portion inserted into the front-tip insertion hole such that the front tip thereof can protrude and retract on the inspection object side and a rear-tip portion inserted into the rear-tip insertion hole, and an electrode that is disposed behind the rear-tip support member and comes in contact with the rear-tip portion is known, in which the probe smoothly flexes such that an intermediate portion of the probe between the front-tip support member and the rear-tip support member is inclined when the front tip of the probe comes in contact with an inspection object by employing a configuration in which the front-tip portion of the probe is disposed at a position which is offset to the inclined side in the probe guiding direction of the rear-tip insertion hole with respect to the rear-tip portion.

By disposing the front-tip portion of the probe at a position which is offset to the inclination side of the probe guiding direction of the rear-tip insertion hole with respect to the rear-tip portion, the inclination direction of the probe guiding direction of the rear-tip insertion hole is made to coincide with the direction of the inclined posture of the probe which has been attached or will be attached. Accordingly, it is possible to easily extract and insert the probe from and into the back of the rear-tip support member, to easily replace the probe without providing a complicated structure such as a mechanism for shifting the front-tip support member and the rear-tip support member in the planar direction or the like as in the related art, and to smoothly bend the probe when the front tip of the probe comes in contact with an inspection object.

Patent Literature 2 discloses a configuration in which the probe can be smoothly bent when the front tip of the probe comes in contact with an inspection object by providing an inclined portion in which the probe guiding direction is inclined with respect to a direction perpendicular to an opposing surface in at least one of the front-tip insertion hole and the rear-tip insertion hole, disposing one of the front-tip portion and the rear-tip portion of the probe at a position which is offset to the inclination side of the inclined portion with respect to the other of the front-tip portion and the rear-tip portion, and inclining the intermediate portion of the probe between the front-tip support member and the rear-tip support member (see FIG. 15). By causing the inclination direction of the inclined portion to coincide with the direction of the inclined posture of the attached probe, it is possible to easily extract and insert the probe from and into the front of the front-tip support member or the back of the rear-tip support member and to easily replace the probe without providing a complicated structure such as a mechanism for shifting the front-tip support member and the rear-tip support member in the planar direction or the like as described in Patent Literature 1.

CITATION LIST

Patent Literature

[Patent Literature 1]
Japanese Patent Application Laid-Open No. H9-274054
[Patent Literature 2]
Japanese Patent Application Laid-Open No. 2005-338065

SUMMARY OF INVENTION

However, in the substrate inspection device disclosed in Patent Literature 1, when an inspection jig which is mounted thereon is manufactured, complicated operations such as an operation of inserting both ends of a probe which is provided to extend in a straight line shape into through-holes of two guide plates and fixing a probe needle to inner walls of the through-holes of the two guide plates, an operation of forming a predetermined bending portion in the probe by moving the guide plates relative to each other, an operation of releasing fixation to the through-hole of at least one guide plate, and an operation of fitting a frame between the two guide plates and supporting the two guide plates to be parallel to each other are required and thus it is not possible to avoid an increase in manufacturing costs for the device.

On the other hand, as disclosed in Patent Literature 2, by inclining the probe guiding direction of the rear-tip support hole with respect to the probe guiding direction of the front-tip insertion hole, specifically, by sequentially stacking a plurality of support plates 102 to 104 from the front tip side to form the rear-tip support member 101, forming through-holes 105 to 107 in the support plates 102 to 104, and setting the centers of the through-holes 105 to 107 to be slightly offset in a predetermined direction as illustrated in FIG. 15, one rear-tip insertion hole into which the rear-tip portion of the probe Pr is inserted is formed. With this configuration, an intermediate portion of the probe Pr between the front-tip support member 201 which is installed to face an inspection object and the rear-tip support member 101 is supported along a support line V which is inclined by a predetermined angle with respect to a reference line Z in a direction perpendicular to the installation direction of the front-tip support member 201 and the probe Pr can be smoothly bent when the front tip of the probe Pr comes in contact with an inspection object.

By disposing the front-tip portion of the probe at a position along the probe guiding direction of the rear-tip insertion hole relative to the rear-tip portion thereof, the inclination direction of the probe guiding direction of the rear-tip insertion hole and the direction of the inclination posture of the probe which has been attached or will be attached thereto can be caused to coincide with each other and thus it is possible to easily extract and insert the probe from and into the rear side of the rear-tip support member. Accordingly, without a complicated structure such as a mechanism for shifting the front-tip support member and the rear-tip support member in a planar direction as in the inspection jig described in Patent Literature 1, it is possible to easily replace the probe.

However, when the rear-tip portion of the probe is supported in an inclined state in the rear-tip support hole disposed in the rear-tip support member aforementioned and the probe is configured to be bent when the front tip of the probe comes in contact with an inspection object, there is a problem in that the inner diameter of the rear-tip support hole needs to be set to be much larger than the outer diameter of the probe, rattling will be easily caused in the rear tip of the probe, and it is difficult to stably support the probe.

An objective of the disclosure provides an inspection jig and a substrate inspection device that can stabilize a supporting state of a probe with a simple configuration.

According to an aspect of the disclosure, there is provided an inspection jig that brings a probe into contact with an inspection point which is provided on a substrate which is an inspection object, the inspection jig including: an inspection-side support member that includes a counter plate which is provided with an opposing surface disposed to face the substrate; and an electrode-side support member that includes a support plate which is disposed to face an electrode plate located on the side opposite to the opposing surface of the counter plate, wherein a probe insertion hole into which a front tip portion of the probe is inserted is formed in the counter plate, wherein a probe support hole which allows a rear tip portion of the probe to be inserted thereinto and supported thereby is formed in the electrode-side support member to correspond to the probe insertion hole of the counter plate, and wherein the probe support hole includes a restricting surface that is formed along a support line which is inclined by a predetermined angle with respect to a reference line in a direction perpendicular to the opposing surface of the counter plate and restricts movement of the rear tip portion of the probe in a direction perpendicular to an inclination direction of the support line.

DESCRIPTION OF EMBODIMENTS

Figure 1:
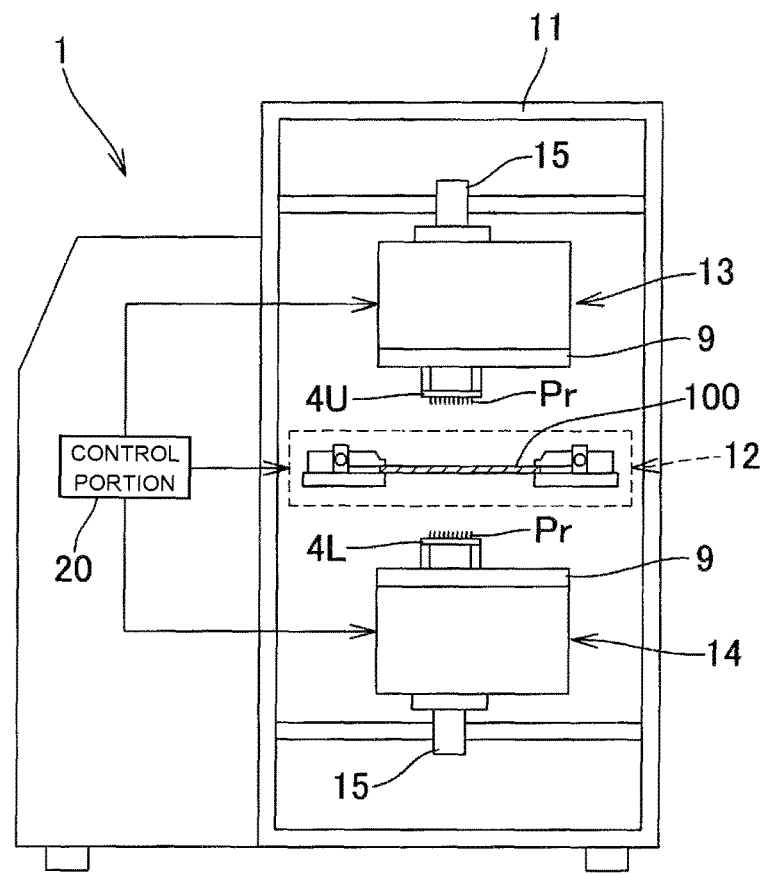
FIG. 1 is a front view schematically illustrating a configuration of a substrate inspection device including an inspection jig according to an embodiment of the disclosure.

Hereinafter, embodiments of the disclosure will be described with reference to the accompanying drawings. Elements which are referred to by the same reference signs in the drawings have the same configuration and description thereof will not be repeated.

First Embodiment

FIG. 1 is a front view schematically illustrating a configuration of a substrate inspection device 1 including an inspection jig according to an embodiment of the disclosure. The substrate inspection device 1 illustrated in FIG. 1 is a device that allows inspection of a circuit pattern formed on a substrate 100 which is an inspection object.

The substrate inspection device 1 illustrated in FIG. 1 includes a housing 11. A substrate fixing device 12, a first inspection portion 13, and a second inspection portion 14 are roughly provided in a space in the housing 11. The substrate fixing device 12 is configured to fix a substrate 100 which is an inspection object to a predetermined position.

Examples of a substrate 100 include various substrates such as a glass epoxy substrate, a flexible substrate, a ceramic multilayer circuit board, an electrode plate for a liquid crystal display or a plasma display, a transparent conductive plate for a touch panel, and a package board or a film carrier for a semiconductor package. Inspection points such as wiring patterns or solder bumps are formed on the substrate 100.

The first inspection portion 13 is located above the substrate 100 fixed to the substrate fixing device 12. The second inspection portion 14 is located below the substrate 100 fixed to the substrate fixing device 12. The first inspection portion 13 and the second inspection portion 14 include an electrode plate 9 which will be described later. Electrodes 91 connected to a scanner circuit which will be described later are formed on the electrode plates 9. Inspection jigs 4U and 4L including a plurality of probes Pr are attached to each of the electrode plates 9 of the first inspection portion 13 and the second inspection portion 14. By attaching the inspection jigs 4U and 4L to the electrode plates 9, the probes Pr come in contact with the electrodes 91. As a result, the probes Pr are electrically connected to the scanner circuit. Accordingly, the circuit patterns formed on the substrate 100 can be inspected. The first inspection portion 13 and the second inspection portion 14 include a scanner circuit which will be described later and an inspection portion moving mechanism 15 that appropriately moves in the housing 11.

The substrate inspection device 1 includes a control portion 20 that controls operations of the substrate fixing device 12, the first inspection portion 13, and the second inspection portion 14. The control portion 20 is constituted, for example, by a microcomputer. The control portion 20 is configured to inspect the circuit patterns formed on the substrate 100 using the inspection jigs 4U and 4L by appropriately moving the first inspection portion 13 and the second inspection portion 14 and bringing the probes Pr of the inspection jigs 4U and 4L into contact with the substrate 100 fixed to the substrate fixing device 12. Since the inspection jigs 4U and 4L have the same configuration, the inspection jigs 4U and 4L are collectively referred to as an inspection jig 4 in the following description.

Figure 2:
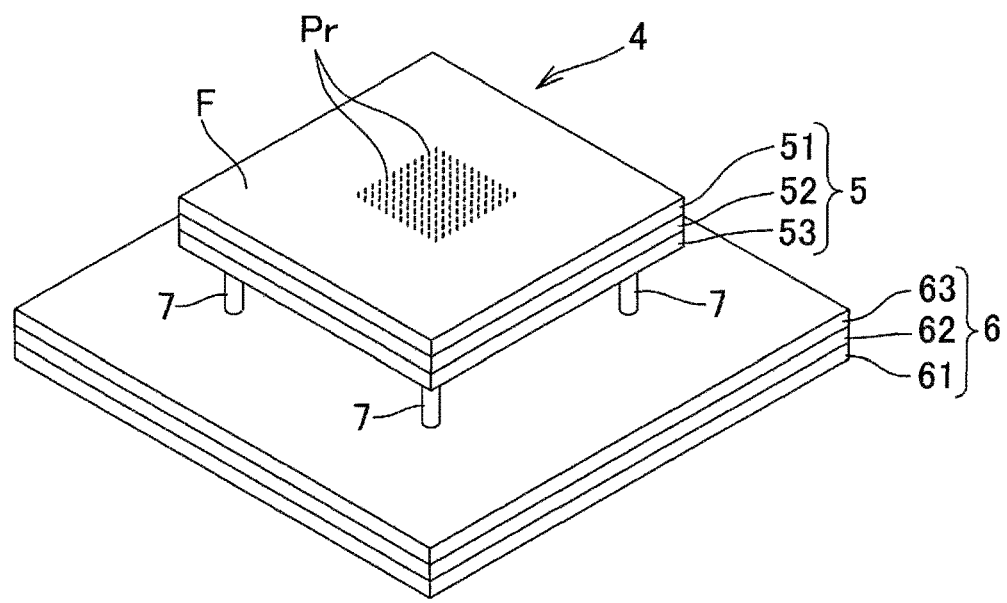
FIG. 2 is a perspective view illustrating an example of the inspection jig illustrated in FIG. 1.
Figure 3:
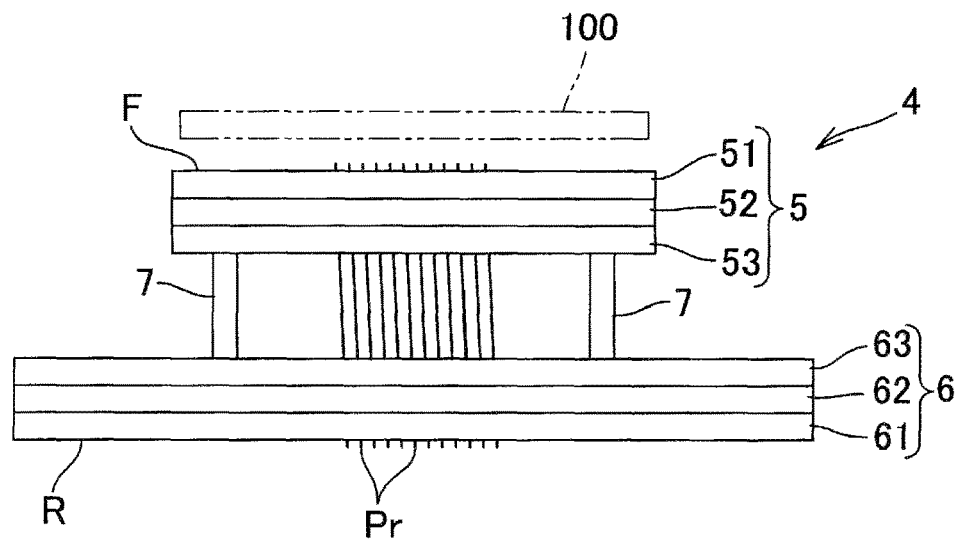
FIG. 3 is a side view of the inspection jig illustrated in FIG. 2.

FIG. 2 is a perspective view illustrating an example of the inspection jig 4 illustrated in FIG. 1. FIG. 3 is a side view of the inspection jig 4 illustrated in FIG. 2. The inspection jig 4 includes an inspection-side support member 5 which is disposed to face the substrate 100, an electrode-side support member 6 which is disposed on the side of the inspection-side support member 5 opposite to the substrate 100 side, and a connection member 7 which keeps the inspection-side support member 5 and the electrode-side support member 6 parallel to each other with a predetermined distance therebetween.

The inspection-side support member 5 is configured by sequentially stacking a counter plate 51 and guide plates 52 and 53 from the side on which the substrate 100 is disposed (a front tip portion side located upside in FIG. 3). The counter plate 51 includes an opposing surface F which is disposed to face the substrate 100. The counter plate 51 is fixed to the guide plates 52 and 53 by fixing detachable means such as a bolt to form a unified body. Accordingly, the counter plate 51 is detachably attached to the guide plates 52 and 53.

The electrode-side support member 6 is configured by sequentially stacking a first support plate 61, a second support plate 62, and a third support plate 63 from the opposite side to the opposing surface F. The surface of the first support plate 61, that is, the surface located downside in FIG. 6 which will be described later, serves as a rear surface R which comes in contact with the electrode plate 9 on which the electrodes 91 which will be described later are formed. The electrodes 91 are connected to a scanner circuit (not illustrated) including, for example, an ammeter, a voltmeter, a current source, a multiplexer, and various switching circuits. Accordingly, the rear tip portion of a probe Pr is connected to the scanner circuit via the electrode 91 by attaching the electrode plate 9 to the electrode-side support member 6.

Figure 6:
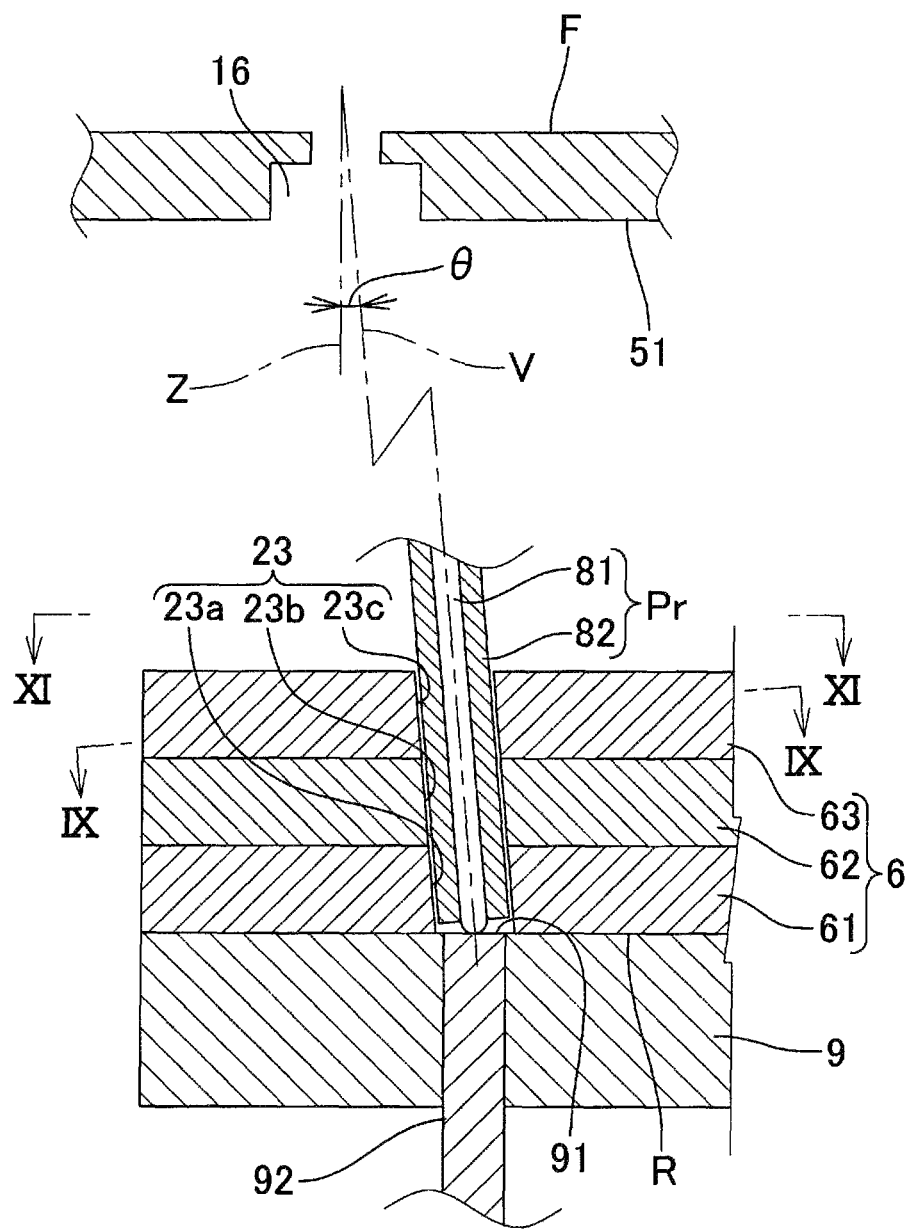
FIG. 6 is a sectional view taken along line VI-VI of an electrode-side support member, an electrode plate, and a probe illustrated in FIG. 4.

A distance from the opposing surface F of the counter plate 51 to the rear surface R of the first support plate 61 of the electrode-side support member 6 is set to be slightly shorter than the length of the probe Pr. Accordingly, when the electrode plate 9 is attached to the electrode-side support member 6 as illustrated in FIG. 6 which will be described later, the rear tip portion of the probe Pr comes in contact with the electrode 91 and is locked and the front tip portion of the probe Pr protrudes slightly from the opposing surface F.

When a substrate 100 comes in press contact with the counter plate 51 in this state, the front tip portion of each probe Pr is pressed by the substrate 100 and the front tip portion of the probe Pr comes in press contact with an inspection point of the substrate 100 due to a biasing force based on elasticity of the probe Pr.

The scanner circuit supplies a predetermined current between a pair of probes Pr corresponding to an inspection place in accordance with a control signal from the control portion 20, measures a voltage between the pair of probes Pr corresponding to the inspection plate, and transmits the measurement results to the control portion 20.

The control portion 20 performs substrate inspection on the basis of the measurement results acquired from the scanner circuit. Specifically, for example, the control portion 20 presses the inspection-side support member 5 of the inspection jig 4 against the substrate 100 and brings the probes Pr into contact with inspection points. Then, the control portion 20 causes an inspection current preset by the scanner circuit to flow between a probe Pr in contact with one inspection point of two inspection points on an inspection object and a probe Pr in contact with the other inspection point, and causes the scanner circuit to measure a voltage between the probe Pr in contact with one inspection point and the probe Pr in contact with the other inspection point as a detection voltage. The control portion 20 determines the quality of the substrate 100, for example, by comparing the detection voltage or a resistance value between the inspection points calculated from the detection voltage with a preset reference value.

Figure 4:
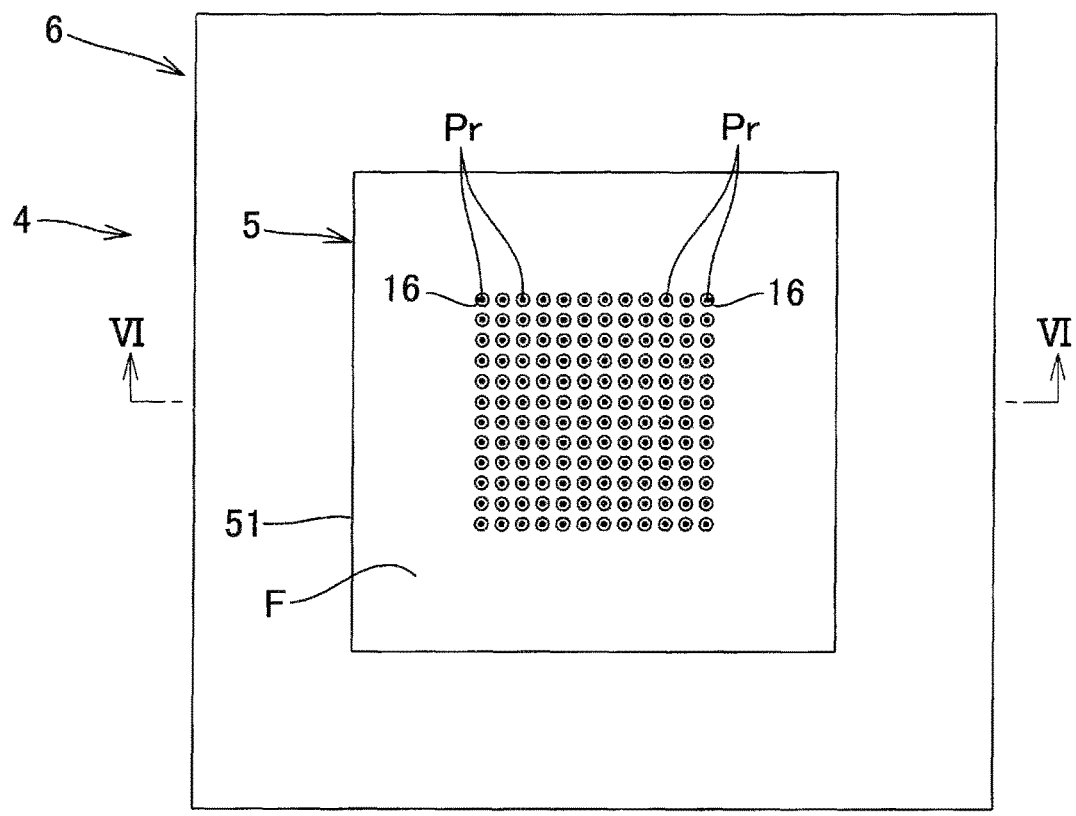
FIG. 4 is a plan view of the inspection jig illustrated in FIGS. 1 and 2 when seen from an opposing surface side.
Figure 5:
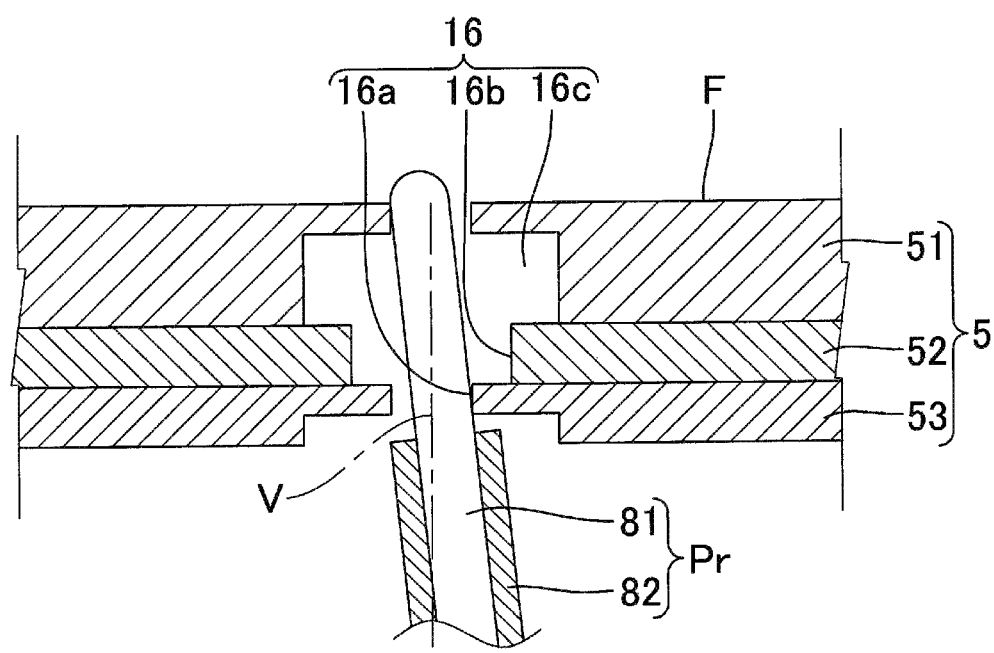
FIG. 5 is a sectional view taken along line VI-VI of an inspection-side support member and a probe illustrated in FIG. 4.

FIG. 4 is a plan view of the inspection jig 4 illustrated in FIGS. 1 and 2 when seen from the opposing surface F side. FIGS. 5 and 6 are sectional views taken along line VI-VI in FIG. 4 illustrating the configurations of the inspection-side support member 5, the electrode-side support member 6, and a probe Pr. As illustrated in FIG. 4, a plurality of probe insertion holes 16 into which the probes Pr are inserted are formed in the inspection-side support member 5 to correspond to the probes Pr.

A probe Pr includes, for example, a rod-shaped conductor portion 81 with a diameter of about 100 µm and an insulating portion 82 covering the outer circumferential surface of the conductor portion 81. The insulating portion 82 is formed of an insulator such as a synthetic resin. An insulating coating which is formed by coating the surface of the conductor portion 81 with an insulating material can be used as the insulating portion 82. In the front tip portion of the probe Pr, the insulating portion 82 is not formed but an exposed portion from which the conductor portion 81 is exposed is provided, and the tip thereof is formed in a semi-spherical shape.

Referring to FIG. 5, the front tip portion of the probe Pr, that is, the exposed portion of the conductor portion 81 located on the substrate 100 side which is an inspection object, is inserted into and supported by a probe insertion hole 16 of the inspection-side support member 5 at the time of inspection, and the tip of the probe Pr comes in contact with an inspection point formed on the substrate 100 and the tip is electrically connected to the inspection point. The substrate 100 is disposed to face the opposing surface F in a state in which the position of the substrate in the horizontal direction relative to the inspection jig 4 is determined by a positioning mechanism which is not illustrated.

Through-holes 16c, 16b, and 16a constituting the probe insertion hole 16 are respectively formed in the counter plate 51 and the guide plates 52 and 53 of the inspection-side support member 5 as illustrated in FIG. 5. By disposing the through-holes 16c, 16b, and 16a to communicate with each other, one probe insertion hole 16 through which the front-tip portion of the probe Pr is inserted is formed. The through-hole 16c penetrating the counter plate 51 corresponds to an example of a probe insertion hole.

Each of the through-holes 16c, 16b, and 16a formed in the counter plate 51 and the guide plates 52 and 53 respectively are disposed in a concentric form. In the embodiment illustrated in FIG. 5, the through-holes 16a and 16c respectively include an small-diameter portion of an upper side and a large-diameter portion of a lower side which is formed with a diameter greater than that of the small-diameter portion. The small-diameter portions of the through-holes 16a and 16c are respectively formed with an inner diameter slightly larger than the outer diameter of the conductor portion 81 of the probes Pr and slightly smaller than the outer diameter of the insulating portion 82. The inner diameter of the through-hole 16b is set to be slightly larger than that of the small-diameter portions of the through-holes 16a and 16c.

Referring to FIG. 6, an end of a wire cable 92 is intruded into the electrode plate 9 from a rear surface opposite to an attachment surface with respect to the electrode-side support member 6 to penetrate the electrode plate 9 in the thickness direction thereof. The attachment surface of the electrode plate 9 to the electrode-side support member 6 is polished flat and end surfaces of a plurality of wire cables 92 are exposed. The end surfaces of the wire cables 92 serve as electrodes 91. Each wire cable 92 is connected to the scanner circuit.

A probe support hole 23 that guides a rear tip portion of each probe Pr to the corresponding electrode 91 is formed in the electrode-side support member 6. The probe support hole 23 supports the rear tip portion of the probe Pr such that a front tip portion of the probe Pr is directed in a direction along an extension line of a support line V which will be described later. The rear tip portion of the probe Pr, that is, an electrode-side tip portion located on the electrode plate 9 side, is formed in a semi-spherical shape and is guided to a contact surface of the electrode 91 by the probe support hole 23 (see FIG. 6), and the rear tip of the probe Pr comes in electrical contact with the electrode 91.

Figure 7:
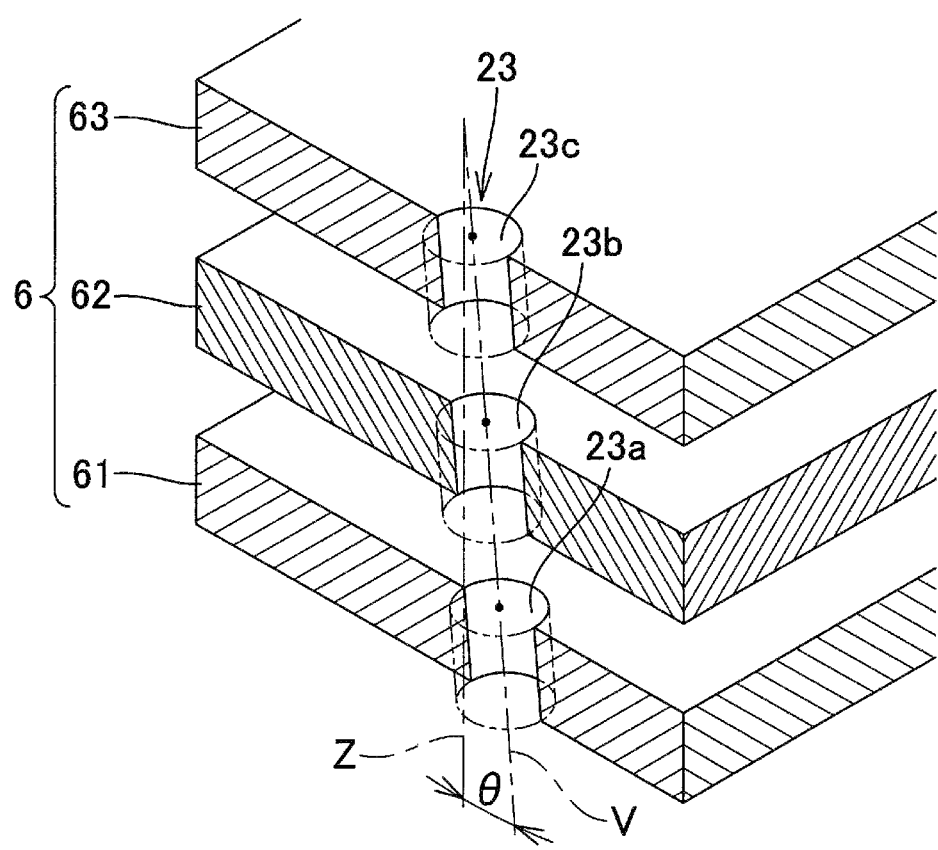
FIG. 7 is a sectional perspective view illustrating details of a probe support hole.

FIG. 7 is a sectional perspective view illustrating details of the probe support hole 23. As illustrated in FIGS. 6 and 7, the probe support hole 23 is formed in the first support plate 61, the second support plate 62, and the third support plate 63 which constitute the electrode-side support member 6 to correspond to the probe insertion hole 16 of the inspection-side support member 5. When a probe Pr is inserted into the probe support hole 23, the probe support hole 23 guides and supports the rear tip portion of the probe to the electrode 91 side. Specifically, a first support hole 23a, a second support hole 23b, and a third support hole 23c through which the rear tip portion of a probe Pr is inserted are respectively formed in the first support plate 61, the second support plate 62, and the third support plate 63 of the electrode-side support member 6. One probe support hole 23 is constituted by allowing the first support hole 23a, the second support hole 23b, and the third support hole 23c to communicate with each other.

Figure 8:
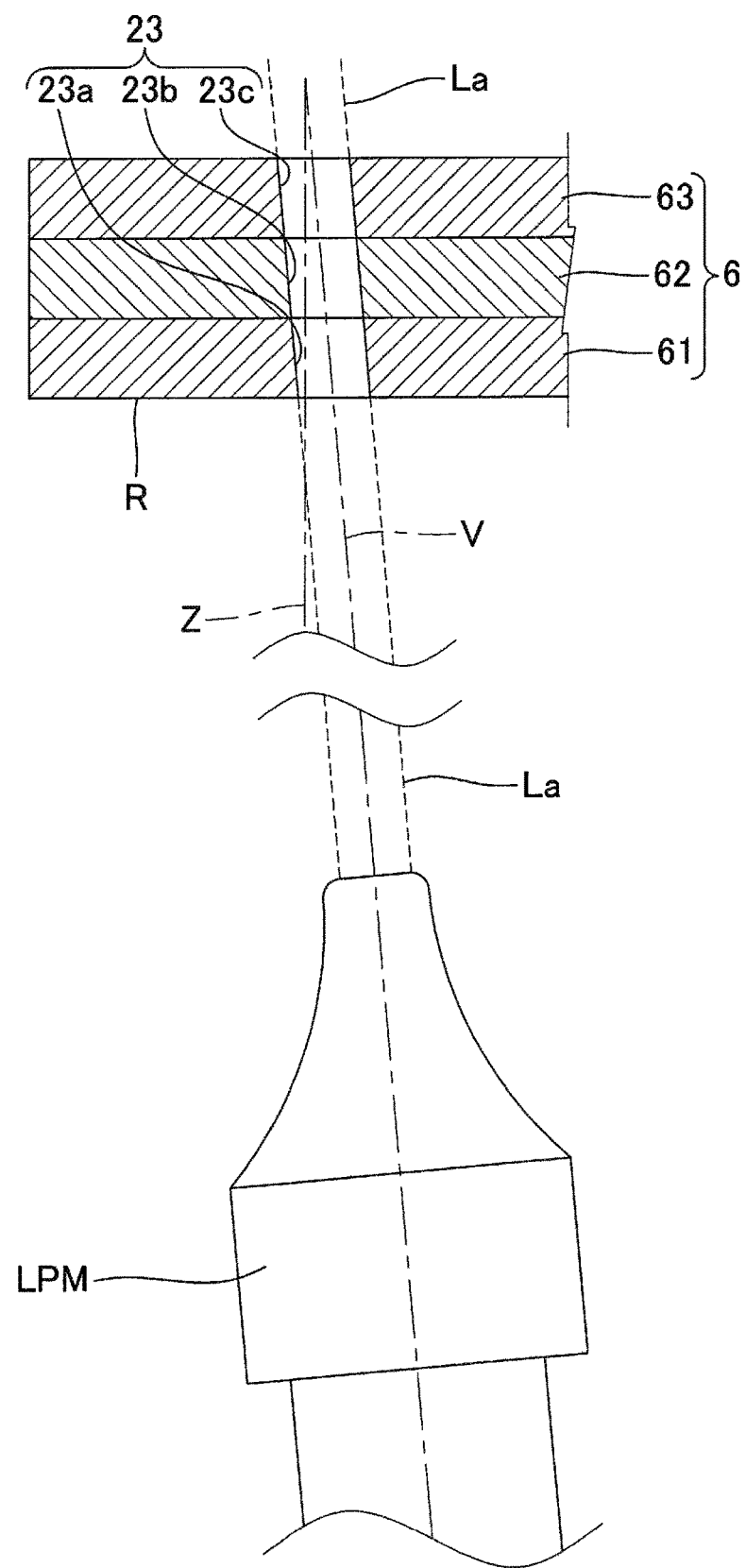
FIG. 8 is a diagram illustrating a method of forming a probe support hole.
Figure 9:
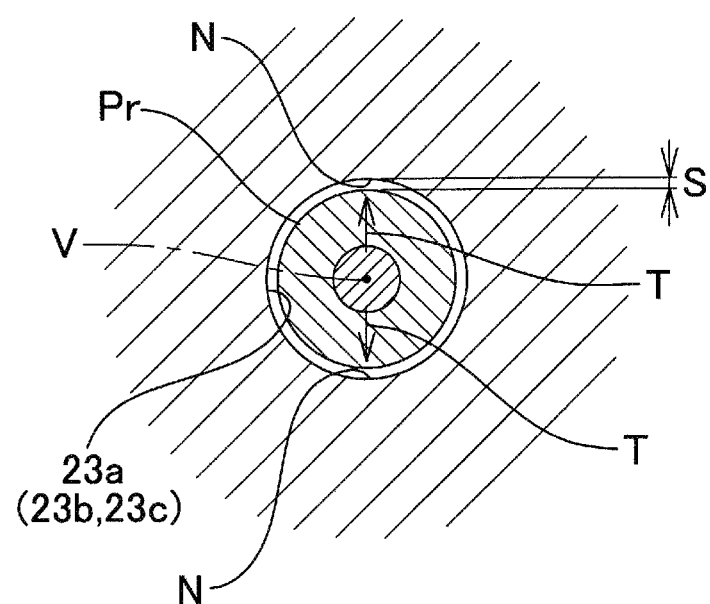
FIG. 9 is a sectional view taken along line IX-IX of a probe and a support plate illustrated in FIG. 6.
Figure 10:
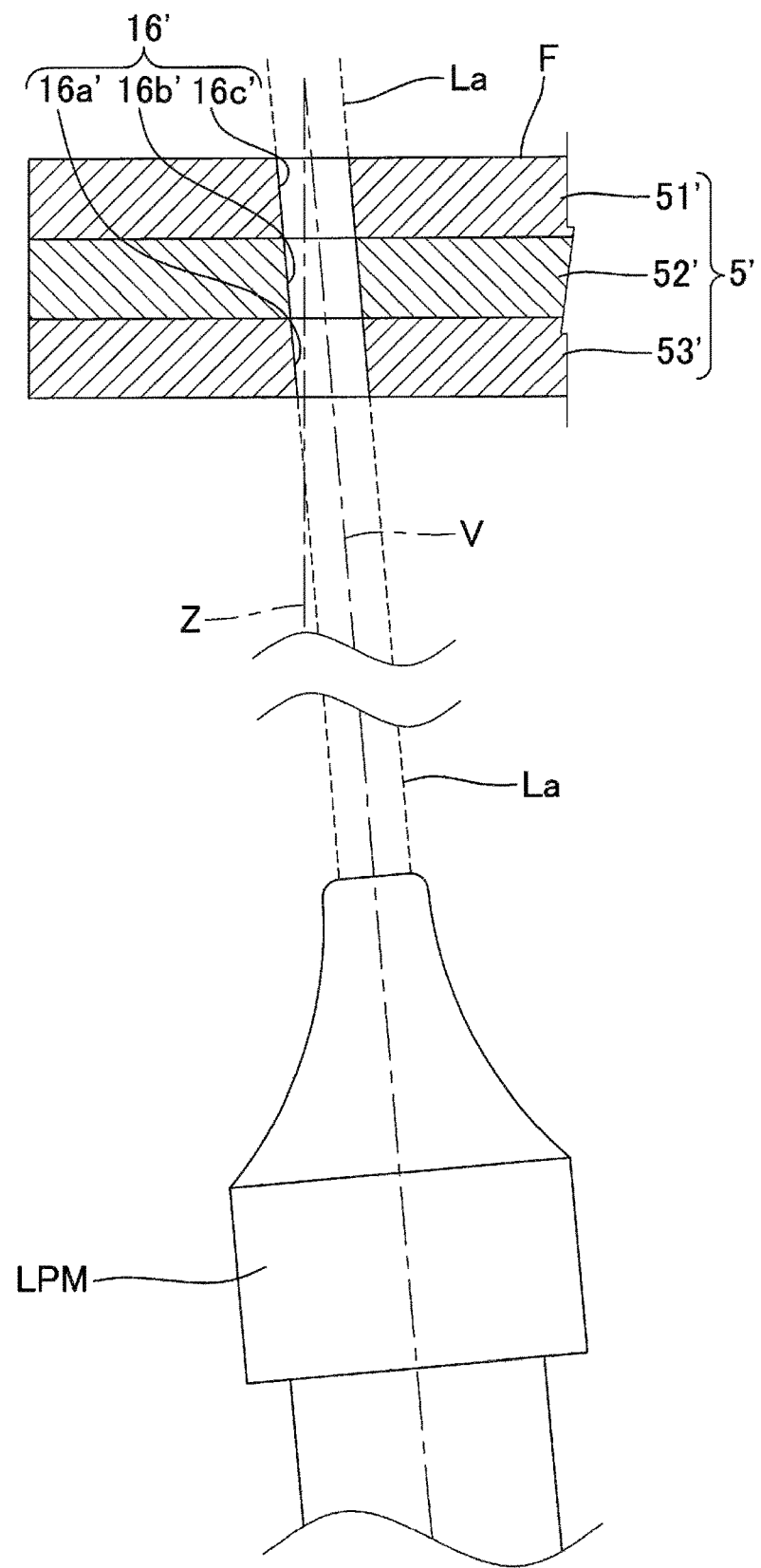
FIG. 10 is a diagram illustrating a modified example of a probe insertion hole.
Figure 11:
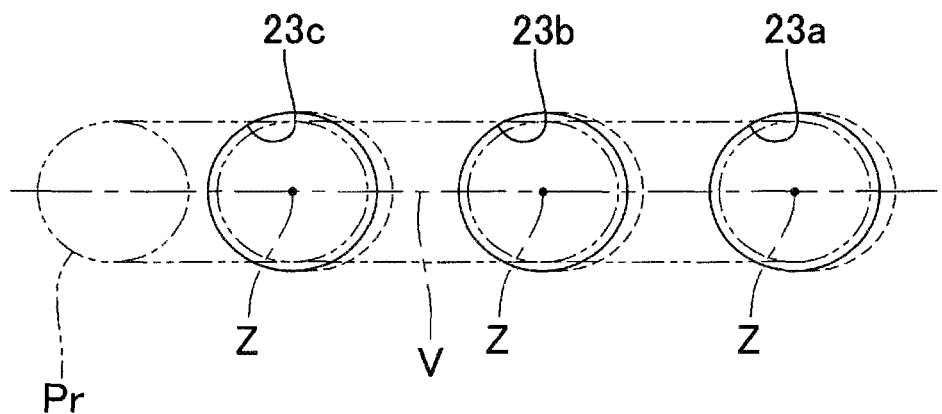
FIG. 11 is a diagram illustrating a probe support hole when seen in a direction of an arrow XI-XI in FIG. 6.

FIG. 8 is a diagram illustrating a method of forming a probe support hole 23. FIG. 9 is a sectional view taken along line IX-IX of a probe Pr and a electrode-side support member 6 illustrated in FIG. 6. FIG. 10 is a sectional diagram illustrating a modified example of a probe insertion hole. FIG. 11 is a diagram illustrating a probe support hole when seen in a direction of an arrow XI-XI (a direction of the reference line Z) in FIG. 6. In FIG. 11, each of the probe support holes 23c, 23b, and 23a are offset in the right-left direction of the drawing in order to easily understand a supporting state of a probe Pr.

A probe support hole 23 is formed along a support line V which is inclined with respect to a direction perpendicular to the opposing surface F of the counter plate 51, that is, a reference line Z extending in the up-down direction (the vertical direction) of FIG. 6, by a predetermined angle θ. Specifically, as illustrated in FIG. 8, laser beam processing is performed on the support plates 61 to 63 by applying a laser beam La having a substantially perfect circular sectional shape from the rear surface R side of the first support plate 61 along the support line V using a laser beam processing machine LPM in a state in which the first support plate 61, the second support plate 62, and the third support plate 63 of the electrode-side support member 6 are superimposed and located. Accordingly, as illustrated in FIG. 9 which is a sectional view taken along IX-IX of FIG. 6, the first support hole 23a, the second support hole 23b, and the third support hole 23c which have an inner diameter slightly larger than the other diameter of the probe Pr and in which a sectional shape in a direction perpendicular to the support line V is a substantially perfect circular shape are continuously formed in the first support plate 61, the second support plate 62, and the third support plate 63.

The probe support hole 23 may be formed in the first support plate 61, the second support plate 62, and the third support plate 63 by disposing the laser beam processing machine LPM on the third support plate 63 side and applying a laser beam La from the opposite side (the upper side in FIG. 8) of the rear surface R of the first support plate 61 along the support line V.

In this way, the probe support hole 23 including the first support hole 23a, the second support hole 23b, and the third support hole 23c which are continuous along the support line V inclined by a predetermined angle θ with respect to the reference line Z in a direction perpendicular to the opposing surface F of the counter plate 51 is formed in the electrode-side support member 6 including the first support plate 61, the second support plate 62, and the third support plate 63. As a result, without providing a complicated structure such as a mechanism for shifting the front-tip support member and the rear-tip support member in the planar direction like the inspection jig described in Patent Literature 1, it is possible to support the probe Pr in a state in which the probe Pr is inclined along the support line V by inserting the rear tip portion of the probe Pr into the probe support hole 23.

Accordingly, when a front tip of a probe Pr comes in contact with a substrate 100 at the time of inspection of the substrate 100 and is pressed against the electrode plate 9 side, an intermediate portion of the probe Pr which is inclined can be easily bent. By restricting the bending direction (the bending direction) of the probe Pr to the inclination direction, it is possible to effectively prevent various problems due to bending of a plurality of probes Pr supported by the inspection jig 4 in arbitrary directions, for example, damage of neighboring probes Pr due to contact therebetween and unevenness in contact pressure due to a difference in inclination between the probes Pr.

In this embodiment, since the probe support hole 23 is formed by insertion holes (the first support hole 23a, the second support hole 23b, and the third support hole 23c) which are formed such that the sectional shape in a direction perpendicular to the support line V is a substantially perfect circular shape as illustrated in FIG. 9, there is an advantage that an installation operation and a replacement operation of a probe Pr and the like can be easily performed via the probe support hole 23. There is also an advantage that the rear tip portions of the probes Pr can be stably supported by the electrode-side support member 6.

Figure 15:
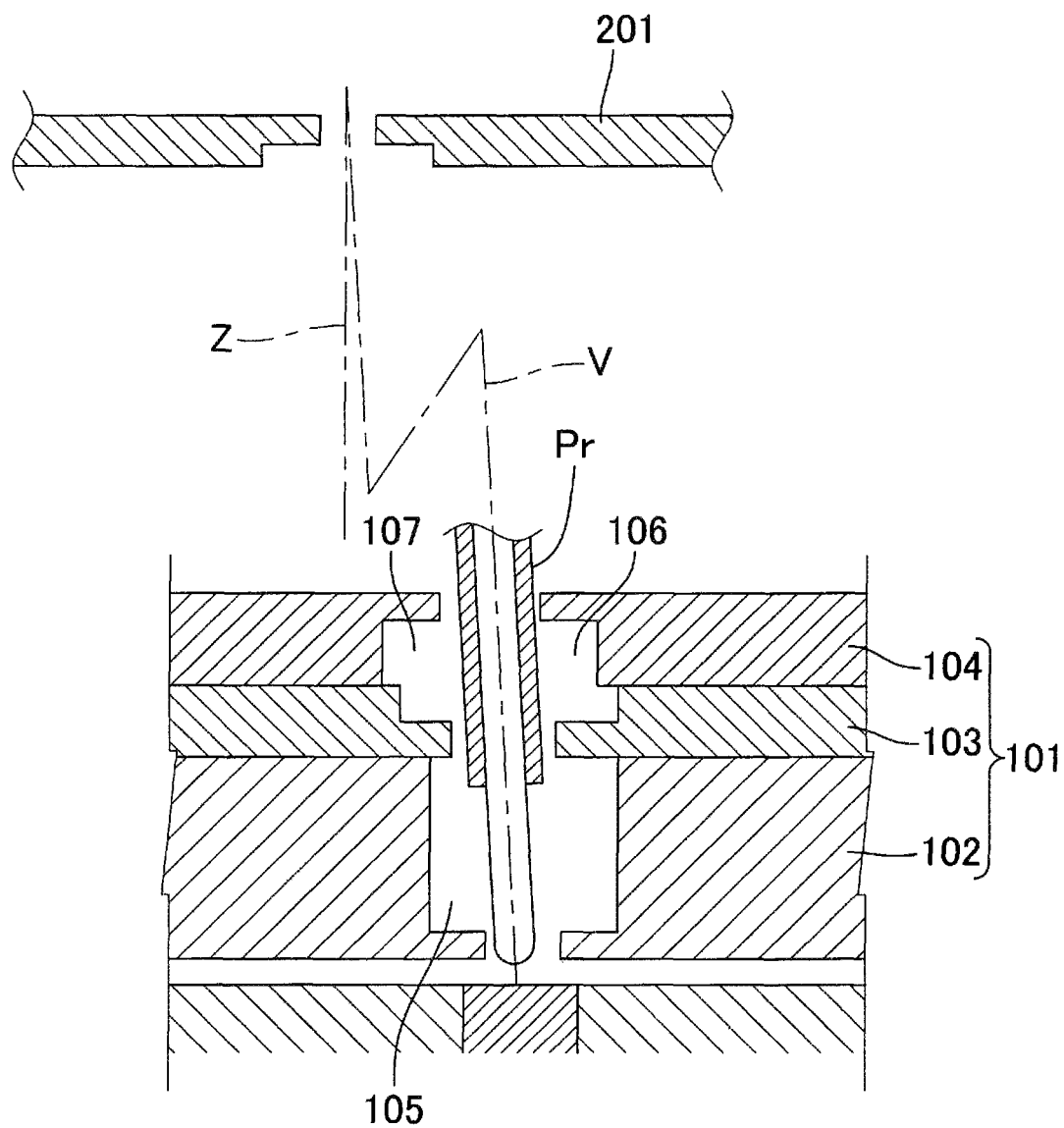
FIG. 15 is a diagram illustrating a conventional example and corresponding to FIG. 6.

For example, unlike the conventional example (see FIG. 15) disclosed in Patent Literature 2, that is, a case in which one probe support hole (a rear-tip insertion hole) through which the rear tip portion of a probe is inserted is formed by forming through-holes respectively in a plurality of support plates constituting the inspection-side support member (the rear-tip support member) and slightly offsetting the centers of the through-holes in a predetermined direction, it is not required to set the inner diameter of the probe support hole to be much larger than the outer diameter of the probe in the inspection jig 4 and it is thus possible to stably support the base end portion of a probe Pr without causing rattling.

Figure 16:
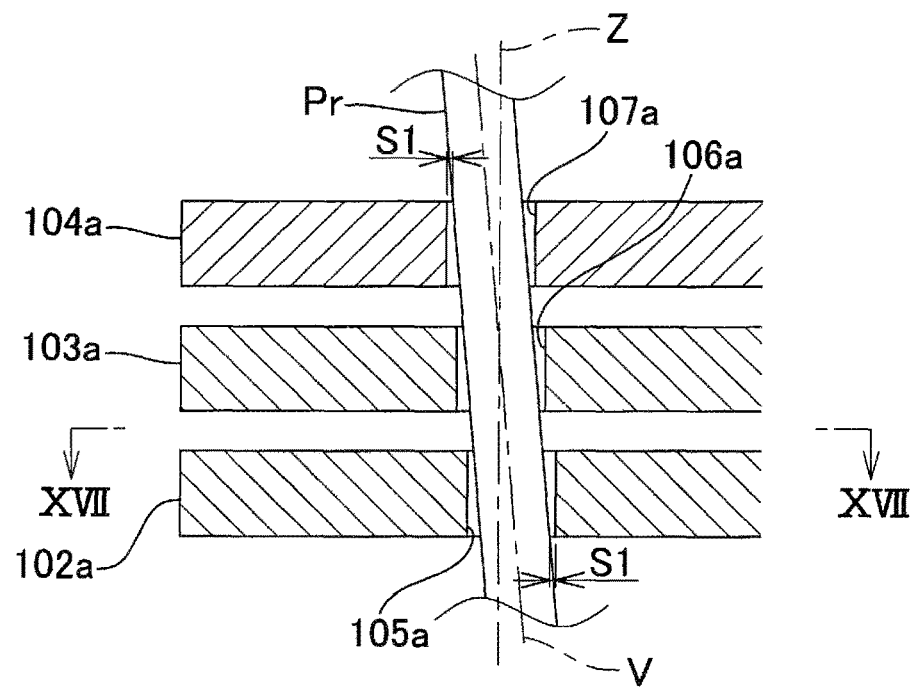
FIG. 16 is a diagram illustrating a comparative example for describing advantages of the disclosure.
Figure 17:
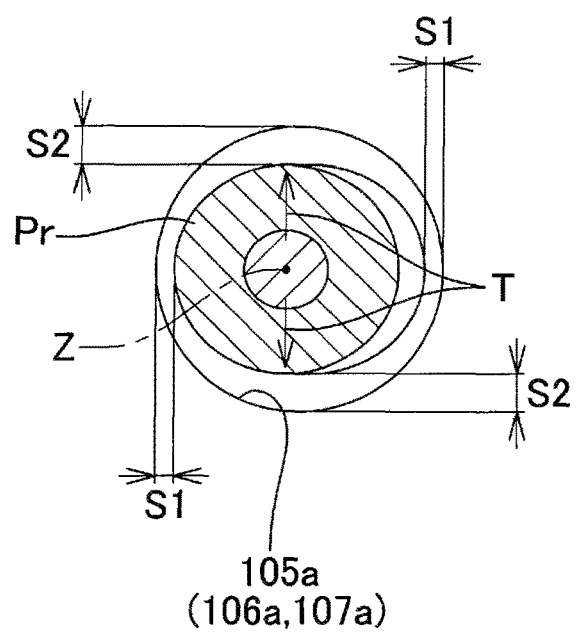
FIG. 17 is a diagram illustrating a comparative example for describing advantages of the disclosure.

FIGS. 16 and 17 are diagrams illustrating a comparative example for describing advantages of the disclosure. FIG. 16 is a schematic diagram schematically illustrating a probe support structure in which support plates 102a to 104a having circular through-holes 105a to 107a in the vertical direction formed therein are stacked. FIG. 17 is a sectional view taken along line XVII-XVII in FIG. 16, that is, a sectional view when seen in an axial direction of the reference line Z.

That is, in the example illustrated in FIGS. 16 and 17, through-holes 105a to 107a are respectively formed along the reference line Z extending in a direction (the up-down direction in FIG. 16) perpendicular to the installation direction of the front-tip support member in three support plate 102a to 104a constituting the rear-tip support member. One rear-tip insertion hole 101a through which a rear tip portion of a probe Pr is inserted is constituted by setting the centers of the through-holes 105a to 107a to be slightly offset in a predetermined direction with respect to the reference line Z. When this configuration is employed, the formation direction of the through-holes 105a to 107a along the reference line Z and the installation direction of a probe Pr along the support line V of the probe inclined by a predetermined angle with respect to the reference line Z are different from each other. As a result, in order to insert a probe Pr through the through-holes 105a to 107a, it is required to set the inner diameters of the through-holes 105a to 107a to be much larger than the outer diameter of the probe Pr.

For example, even when a gap S1 between the upper-left portion and the lower-right portion of the through-holes 105a to 107a and the circumferential surface of the probe Pr is set to be sufficiently small in order to prevent a probe Pr from rattling in the inclination direction of the probe Pr, that is, in the right-left direction in FIG. 16, an increase to a certain degree of a gap S2 between the circumferential surface of the through-holes 105a to 107a and the circumferential surface of the probe Pr in a direction perpendicular to the right-left direction in FIG. 16 in which the support line V extends, that is, in the up-down direction indicated by an arrow T in FIG. 17, cannot be avoided and rattling of the probe Pr in this direction cannot be prevented.

On the other hand, when the probe support hole 23 is formed by insertion holes having a substantially perfect circular sectional shape (see FIG. 9) in a direction perpendicular to the support line V, that is, the first support hole 23a, the second support hole 23b, and the third support hole 23c as in this embodiment, the gap S between the inner circumferential surface of the probe support hole 23 and the outer circumferential surface of a probe Pr can be set to be substantially constant over the entire length in the thickness direction of the first support plate 61, the second support plate 62, and the third support plate 63 and over the entire circumference in the circumferential direction of the probe Pr. Accordingly, by setting the gap S to as a small value as possible, it is possible to effectively curb rattling in the right-left direction corresponding to the direction in which the support line V extends, that is, in the right-left direction in FIG. 11 corresponding to a plan view of the first support hole 23a, the second support hole 23b, and the third support hole 23c illustrated in FIG. 6, and rattling in the up-down direction in FIG. 9 indicated by an arrow T.

In other words, by forming the probe support hole 23 using the insertion holes (the first support hole 23a, the second support hole 23b, and the third support hole 23c) of which the sectional shape in the direction perpendicular to the support line V is a substantially perfect circular shape as illustrated in FIG. 9, the restricting surface for effectively restricting movement of the rear tip portion of a probe Pr in the direction perpendicular to the right-left direction in which the support line V extends in a plan view as illustrated in FIG. 11, that is, in the direction up-down direction in FIG. 11 and the direction indicated by the arrow T in FIG. 9 is formed using the inner circumferential surfaces N and N of the first support hole 23a, the second support hole 23b, and the third support hole 23c which face each other in the up-down direction in FIG. 9.

For example, when a probe Pr has an outer diameter of 70 μm, by setting the inner diameter of the first support hole 23a, the second support hole 23b, and the third support hole 23c to range from 84 μm to 86 μm, for example, to 85 μm such that the gap S ranges from 7.0 μm to 8.0 μm, for example, about 7.5 μm, it is possible to easily insert the rear tip portion of the probe Pr, to effectively prevent the rear tip portion of the probe Pr from rattling along the support line V, and to form a probe support hole 23 that can stably support the probe.

In this embodiment, since the probe support hole 23 is formed by applying a laser beam to the first support plate 61, the second support plate 62, and the third support plate 63 to perform laser beam processing, it is possible to easily and appropriately form the probe support hole 23 including the insertion holes (the first support hole 23a, the second support hole 23b, and the third support hole 23c) of which the sectional shape in a direction perpendicular to the support line V is a substantially perfect circular shape.

That is, the first support hole 23a, the second support hole 23b, and the third support hole 23c which are formed using insertion holes of which the sectional shape in a direction perpendicular to the support line V is a substantially perfect circular shape can also be formed by providing a drill edge of a drilling machine in a direction along the support line V and obliquely pressing the drill edge against the first support plate 61, the second support plate 62, and the third support plate 63. However, in this case, since hole processing should be performed while obliquely pressing the drill edge against the first support plate 61, the second support plate 62, and the third support plate 63, there are problems in that the drill edge is likely to slide, it is difficult to form an accurate hole, and the drill edge with a small diameter is likely to be folded. On the other hand, when the probe support hole 23 is formed using a laser beam processing machine LPM as described above, it is possible to easily and appropriately form the probe support hole 23 without causing the above-mentioned problems.

Particularly, in the inspection jig including the electrode-side support member 6 as illustrated in FIG. 8, when the probe support hole 23 is formed by applying a laser beam along the support line V in a state in which the first support plate 61, the second support plate 62, and the third support plate 63 are stacked and aligned, there is an advantage that the probe support hole 23 including the first support hole 23a, the second support hole 23b, and the third support hole 23c can be more easily and appropriately formed.

In this embodiment, as illustrated in FIG. 5, one probe insertion hole 16 through which a front tip portion of a probe Pr is inserted is formed by disposing through-holes 16c, 16b, and 16a which are respectively formed in the counter plate 51 and the guide plates 52 and 53 and which are arranged concentrically to communicate with each other, but the disclosure is not limited thereto and the probe insertion hole may be formed in the same way as the probe support hole 23.

For example, as illustrated in FIG. 10, a probe insertion hole 16' constituted by through-holes 16c', 16b', and 16a' of which the sectional shape in the direction perpendicular to the support line V is a substantially perfect circular shape may be formed in a counter plate 51' and guide plates 52' and 53' by applying a laser beam La having a substantially circular sectional shape along the support line V using a laser beam processing machine LPM to perform laser beam processing in a state in which a plurality of counter plate 51' and guide plates 52' and 53' constituting an inspection-side support member 5' are superimposed and aligned.

When this configuration is employed, there is an advantage that the probe insertion hole 16' can be simply formed using the laser beam processing machine LPM and a front tip portion of a probe Pr can be appropriately supported along the support line V.

The probe support hole 23 and the probe insertion hole 16' are not limited to the example using laser beam processing, and may be formed using other processing means such as drilling.

Second Embodiment

Figure 12:
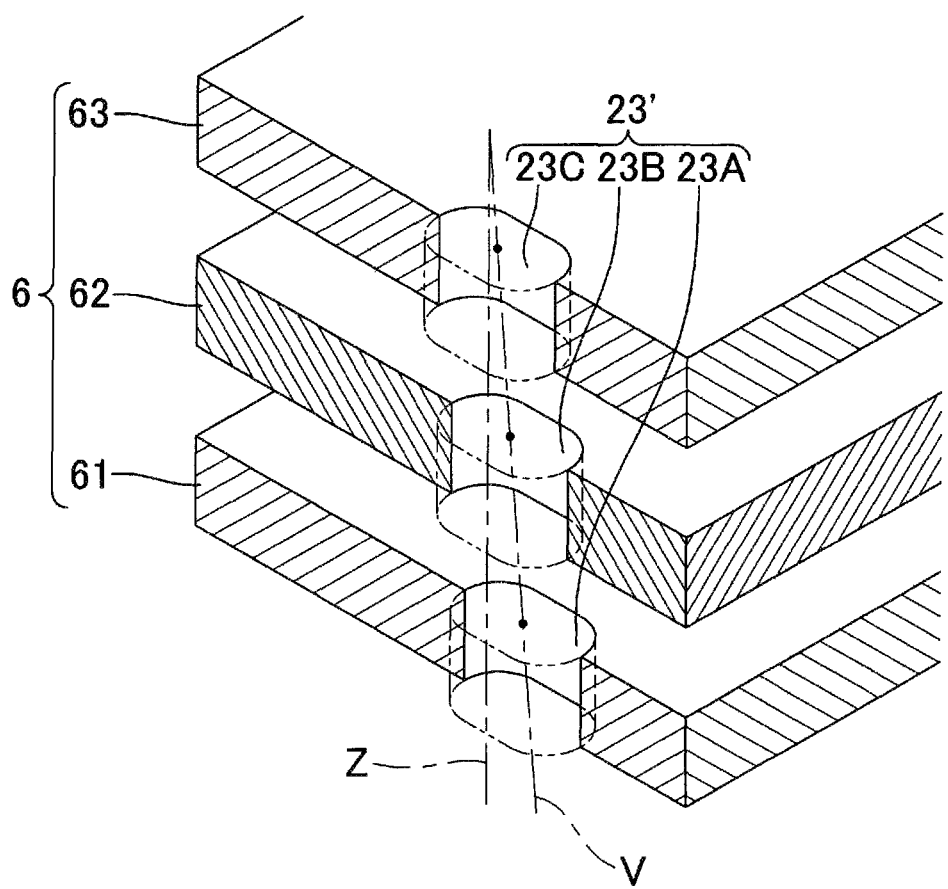
FIG. 12 is a diagram illustrating a second embodiment of the disclosure and corresponding to FIG. 7.
Figure 13:
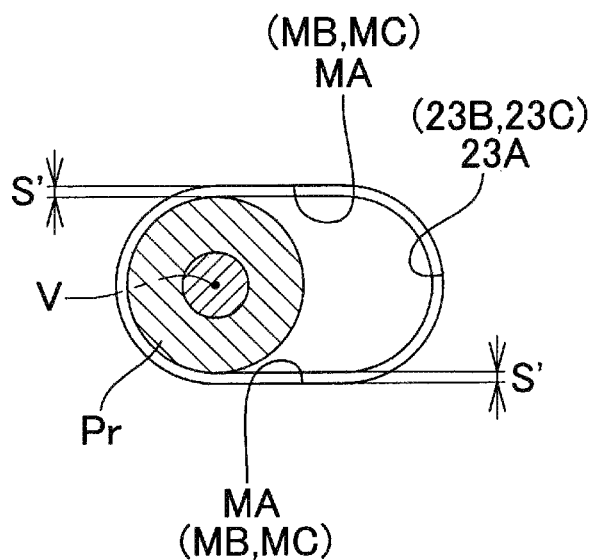
FIG. 13 is a diagram illustrating a supporting state of a probe and corresponding to FIG. 9.
Figure 14:
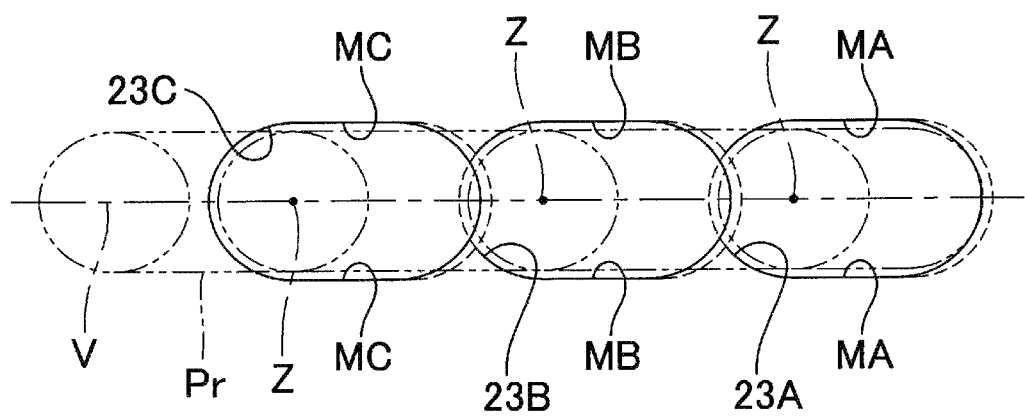
FIG. 14 is a diagram illustrating a supporting state of a probe and corresponding to FIG. 11.

An inspection jig according to a second embodiment of the disclosure will be described below. FIG. 12 is a sectional perspective view illustrating a probe support hole and corresponding to FIG. 7 according to the first embodiment. FIG. 13 is a sectional view illustrating a probe and a supporting plane and corresponding to FIG. 9. FIG. 14 is a diagram illustrating a probe support hole and corresponding to FIG. 11. In FIG. 14, probe support holes 23C, 23B, and 23A are illustrated to be offset in the right-left direction of the drawing for the purpose of easily understanding of a supporting state of a probe Pr.

In the inspection jig according to the second embodiment, as illustrated in FIG. 14, a first support hole 23A, a second support hole 23B, and a third support hole 23C having an elliptical sectional shape including a pair of parallel lines with the same length extending in an inclination direction of a support line V (the right-left direction in FIGS. 13 and 14) and a pair of semi-circles are formed in a first support plate 61, a second support plate 62, and a third support plate 63 constituting an electrode-side support member 6, respectively. A probe support hole 23' which a rear tip portion of a probe Pr is inserted into and supported by is constituted by the first support hole 23A, the second support hole 23B, and the third support hole 23C.

When the probe support hole 23' is formed, a laser beam is applied along a reference line Z from a rear surface side of the first support plate 61 or the opposite side thereof, for example, using a laser beam processing machine LPM and the application position is shifted a predetermined distance in a direction (the right-left direction in FIG. 13) perpendicular to the reference line Z. In this way, the probe support hole 23' is formed. Specifically, as illustrated in FIG. 12, by sequentially forming the first support hole 23A, the second support hole 23B, and the third support hole 23C in the first support plate 61, the second support plate 62, and the third support plate 63, and disposing the centers of the first support hole 23A, the second support hole 23B, and the third support hole 23C to be slightly offset in the direction perpendicular to the reference line Z, the probe support hole 23' that supports a rear tip portion of a probe Pr is formed along the support line V which is inclined by a predetermined angle with respect to the reference line Z.

The first support hole 23A, the second support hole 23B, and the third support hole 23C are not limited to the example in which they are formed by laser beam processing. Since the first support hole 23A, the second support hole 23B, and the third support hole 23C are formed along the reference line Z which is perpendicular to a substrate surface of the first support plate 61, the second support plate 62, and the third support plate 63, holes can be formed vertically in the first support plate 61, the second support plate 62, and the third support plate 63 using a drill and the first support hole 23A, the second support hole 23B, and the third support hole 23C can be easily accurately formed.

The first support hole 23A, the second support hole 23B, and the third support hole 23C have a pair of parallel lines facing each other with the support line V extending inclined in the right-left direction in FIG. 14 interposed therebetween, and restricting surfaces MA, MB, and MC that restrict movement of a rear tip portion of a probe Pr in the direction (the up-down direction in FIG. 14) perpendicular to the inclination direction of the support line V are formed by a pair of parallel surfaces which are formed by the pair of parallel lines.

Specifically, in the first support hole 23A, the second support hole 23B, and the third support hole 23C, a sectional shape which is perpendicular to the reference line Z is an elliptical shape which is a rounded rectangular shape in which both ends of the pair of parallel lines are respectively connected using a semicircle. The longitudinal direction of the elliptical shape is parallel to the inclination direction of the support line V. The pairs of parallel surfaces including a pair of parallel lines in the long holes having an elliptical sectional shape serve as restricting surfaces MA, MB, and MC. The centers of the first support hole 23A, the second support hole 23B, and the third support hole 23C are located at positions which are offset by a preset distance in the inclination direction of the support line V, that is, the longitudinal direction of the long hole. The first support hole 23A, the second support hole 23B, and the third support hole 23C are disposed such that the support line V passes through the centers of the first support hole 23A, the second support hole 23B, and the third support hole 23C.

In this way, when the probe support hole 23' of the electrode-side support member 6 is formed using the first support hole 23A, the second support hole 23B, and the third support hole 23C of which the sectional shape is an elliptical shape having a pair of parallel lines extending in the inclination direction of the support line V and the pairs of restricting surfaces MA, MB, and MC that restrict movement of a rear tip portion of a probe in the direction perpendicular to the inclination direction of the support line V are formed by the pairs of parallel lines forming the first support hole 23A, the second support hole 23B, and the third support hole 23C and, for example, when the outer diameter of a probe Pr is 110 μm, an intermediate portion of a probe Pr in an inclined state can be easily bent by forming the first support hole 23A, the second support hole 23B, and the third support hole 23C such that a gap S' formed between the restricting surfaces MA, MB, and MC and the probe Pr ranges from 7.0 μm to 40 μm, for example, is about 35 μm and is preferably about 7.5 μm. For example, when the outer diameter of a probe Pr is 110 μm, the minor diameter of the first support hole 23A, the second support hole 23B, and the third support hole 23C can be set to about 125 μm and the major diameter of the first support hole 23A, the second support hole 23B, and the third support hole 23C can be set to about 200 μm.

In addition, by restricting the bending direction (the bending direction) of a probe Pr to the inclination direction, it is possible to effectively prevent various problems due to bending of a plurality of probes Pr supported by the inspection jig 4 in arbitrary directions, for example, damage due to contact between neighboring probes Pr or unevenness in contact pressure due to differences in inclination between the probes Pr.

Instead of the above-mentioned embodiment in which the first support hole 23A, the second support hole 23B, and the third support hole 23C which are elliptical are formed in the first support plate 61, the second support plate 62, and the third support plate 63 using a laser beam processing machine LPM, the first support hole 23A, the second support hole 23B, and the third support hole 23C may be formed using a drilling machine. However, there is an advantage that the first support hole 23A, the second support hole 23B, and the third support hole 23C which are elliptical can be easily and appropriately formed using the laser beam processing machine LPM.

That is, an inspection jig according to an aspect of the disclosure is an inspection jig that brings a probe into contact with an inspection point which is provided on a substrate which is an inspection object, the inspection jig including: an inspection-side support member that includes a counter plate which is provided with an opposing surface disposed to face the substrate; and an electrode-side support member that includes a support plate which is disposed to face an electrode plate disposed on the side opposite to the opposing surface of the counter plate, wherein a probe insertion hole into which a front tip portion of the probe is inserted is formed in the counter plate, wherein a probe support hole which causes a rear tip portion of the probe to be inserted thereinto and supported thereby is formed in the electrode-side support member to correspond to the probe insertion hole of the counter plate, and wherein the probe support hole includes a restricting surface that is formed along a support line which is inclined by a predetermined angle with respect to a reference line in a direction perpendicular to the opposing surface of the counter plate and restricts movement of the rear tip portion of the probe in a direction perpendicular to an inclination direction of the support line.

A substrate inspection device according to an aspect of the disclosure is a substrate inspection device including: the inspection jig having the above-mentioned configuration; and an inspection portion that is electrically connected to the rear tip portion of the probe and supplies an electrical signal to the rear tip portion of the probe to inspect the substrate.

According to this configuration, since the probe can be supported in a state in which the probe is inclined along the support line by inserting the rear tip portion of the probe into the probe support hole, it is possible to easily bend the intermediate portion of the probe at the time of inspecting the substrate and it is also possible to effectively prevent various problems due to bending of a plurality of probes supported by the inspection jig in arbitrary directions, for example, damage due to contact between neighboring probes or unevenness in contact pressure due to differences in inclination between the probes, by restricting the bending direction (the bending direction) thereof to the inclination direction.

The electrode-side support member may be formed by stacking a plurality of the support plates.

According to this configuration, there is a merit that the probe support holes can be appropriately formed by applying the laser beam along the support line or superimposing the probe support holes formed in the support plates in a state in which the support plates are stacked and aligned.

The probe support hole of the electrode-side support member may be formed such that a sectional section in a direction perpendicular to the support line is substantially a perfect circular shape, and the restricting surface may be formed by a circumferential surface that forms the probe support hole having a substantially perfect circular shape.

According to this configuration, there is a merit that operations of installing and replacing a probe via the probe support hole which is formed such that the sectional shape thereof is a substantially perfect circular shape and the like can be more easily performed and the rear tip portion of the probe can be more stably supported by the electrode-side support member.

The probe support hole of the electrode-side support member may be formed by a support hole having an elliptical section shape with a pair of parallel lines extending in the inclination direction of the support line, the support hole may be respectively formed in the plurality of support plates, the restricting surface may be formed by the pair of parallel lines forming the elliptical support hole, and the probe support hole may be formed by setting the centers of the support holes formed in the plurality of support plates to be slightly offset in a predetermined direction with respect to the reference line.

According to this configuration, by setting the gap formed between the restricting surface defined by the pair of parallel lines and the probe to an appropriate value, the bending direction of the probe in the inclined state can be restricted to the inclination direction and thus it is possible to effectively prevent various problems due to bending of a plurality of probes supported by the inspection jig in arbitrary directions.

In a method for manufacturing an inspection jig according to an aspect of the disclosure, the probe support hole is formed by irradiating the support plates with a laser beam in the inspection jig including the support plates.

According to this configuration, without causing a problem such as folding of a drill edge with a small diameter as in the case in which the probe support hole is formed using a drilling machine, it is possible to more easily and appropriately form the probe support hole.

Particularly, in the inspection jig including a plurality of support plates in which the support plates are stacked, the probe support hole may be formed by applying the laser beam along the support line in a state in which the plurality of support plates have been stacked and located.

According to this configuration, without causing a problem such as folding of a drill edge with a small diameter as in the case in which the probe support hole is formed using a drilling machine, it is possible to more easily and appropriately form the probe support hole of which the sectional shape is a substantially perfect circular shape.

The inspection jig and the substrate inspection device with the above-mentioned configurations can effectively improve contact stability of a probe with an inspection point with a simple configuration.

Priority is claimed on Japanese Patent Application No. 2016-148742, filed Jul. 28, 2016, the content of which is incorporated herein by reference. The specific embodiments or examples described in the Description of Embodiments are merely for clarifying technical details of the disclosure and the disclosure should not be construed in the narrow sense using only the specific examples.

The invention claimed is:

1. An inspection jig that brings a probe into contact with an inspection point which is provided on a substrate which is an inspection object, the inspection jig comprising:
   an inspection-side support member that includes a counter plate which is provided with an opposing surface disposed to face the substrate; and
   an electrode-side support member which is formed by stacking a plurality of support plates, one of the plurality of support plates being disposed to face an electrode plate located on the side opposite to the opposing surface of the counter plate,
   wherein a probe insertion hole into which a front tip portion of the probe is inserted is formed in the counter plate,
   wherein a probe support hole which causes a rear tip portion of the probe to be inserted thereinto and supported thereby is formed in the electrode-side support member to correspond to the probe insertion hole of the counter plate, and
   wherein the probe support hole includes a plurality of support holes respectively formed in the plurality of support plates and being continuous along a support line which is inclined by a predetermined angle with respect to a reference line in a direction perpendicular to the opposing surface of the counter plate, and a restricting surface is formed using inner circumferential surfaces of the plurality of support holes being continuous and restricts movement of the rear tip portion of the probe in a direction perpendicular to an inclination direction of the support line.

2. The inspection jig according to claim 1, wherein the probe support hole is formed such that a sectional section in a direction perpendicular to the support line is substantially a perfect circular shape, and the restricting surface is formed by a circumferential surface that forms the probe support hole having the substantially perfect circular shape.

3. A method for manufacturing the inspection jig according to claim 1, wherein the probe support hole is formed by applying a laser beam along the support line in a state in which the plurality of support plates have been stacked and located.

4. A substrate inspection device comprising:
   the inspection jig according to claim 1; and
   an inspection portion that is electrically connected to the rear tip portion of the probe and supplies an electrical signal to the rear tip portion of the probe to inspect the substrate.

5. A method for manufacturing the inspection jig according to claim 1, wherein the method comprising:
   forming the probe support hole by irradiating the plurality of support plates with a laser beam to perform laser beam processing.

6. The inspection jig according to claim 1, wherein the probe support hole of the electrode-side support member is formed by the plurality of the support holes each having an elliptical section shape with a pair of parallel lines extending in the inclination direction of the support line, the restricting surface is formed by a plurality pair of parallel lines forming the plurality of support holes support hole being elliptical, and the probe support hole is formed by setting the centers of each of the plurality of support holes formed in the plurality of support plates to be slightly offset in a predetermined direction with respect to the reference line.

7. An inspection jig that brings a probe into contact with an inspection point which is provided on a substrate which is an inspection object, the inspection jig comprising:
   an inspection-side support member that includes a counter plate which is provided with an opposing surface disposed to face the substrate; and
   an electrode-side support member which is formed by stacking a plurality of support plates, one of the plurality of support plates being disposed to face an electrode plate located on the side opposite to the opposing surface of the counter plate,
   wherein a probe insertion hole into which a front tip portion of the probe is inserted is formed in the counter plate,
   wherein a probe support hole which causes a rear tip portion of the probe to be inserted thereinto and supported thereby is formed in the electrode-side support member to correspond to the probe insertion hole of the counter plate,
   wherein the probe support hole includes a restricting surface that is formed along a support line which is inclined by a predetermined angle with respect to a reference line in a direction perpendicular to the opposing surface of the counter plate and restricts movement of the rear tip portion of the probe in a direction perpendicular to an inclination direction of the support line, and
   wherein the probe support hole of the electrode-side support member is formed by a plurality of support holes each having an elliptical section shape with a pair of parallel lines extending in the inclination direction of the support line, the plurality of support holes are respectively formed in the plurality of support plates, the restricting surface is formed by a plurality pair of parallel lines forming the plurality of support holes being elliptical, and the probe support hole is formed by setting the centers of each of the plurality of support holes formed in the plurality of support plates to be slightly offset in a predetermined direction with respect to the reference line.

8. A substrate inspection device comprising:
   the inspection jig according to claim 7; and
   an inspection portion that is electrically connected to the rear tip portion of the probe and supplies an electrical signal to the rear tip portion of the probe to inspect the substrate.

9. A method for manufacturing the inspection jig according to claim 7, wherein the method comprising:
   forming the probe support hole by irradiating the plurality of support plates with a laser beam to perform laser beam processing.

* * * * *